United States Patent [19]
Proebsting

[11] Patent Number: 5,859,961
[45] Date of Patent: Jan. 12, 1999

[54] RENUMBERED ARRAY ARCHITECTURE FOR MULTI-ARRAY MEMORIES

[75] Inventor: Robert J. Proebsting, Los Altos Hills, Calif.

[73] Assignee: Townsend and Townsend and Crew LLP, San Fancisco, Calif.

[21] Appl. No.: 656,164

[22] Filed: May 31, 1996

[51] Int. Cl.[6] ................................. G06F 11/00
[52] U.S. Cl. .................................... 395/182.06
[58] Field of Search ................ 395/181, 182.03, 395/182.05, 182.06, 185.01, 185.02, 185.06, 185.07; 371/10.2, 10.3; 365/200, 201; 348/714, 716, 718

[56] References Cited

U.S. PATENT DOCUMENTS

| | | | |
|---|---|---|---|
| 4,453,248 | 6/1984 | Ryan | 365/200 |
| 5,487,040 | 1/1996 | Sukegawa et al. | 395/182.05 |
| 5,592,632 | 1/1997 | Leung et al. | 395/183.19 |

FOREIGN PATENT DOCUMENTS 2 217 769 A  6/1974  France ................ G06F 11/20

OTHER PUBLICATIONS

"Partial Memory Bank Usage for Personal Computers," *IBM Technical Disclosure Bulletin*, vol. 37, No. 7, Jul. 1, 1994, pp. 11–13, XP000455422.

*Primary Examiner*—Albert DeCady
*Attorney, Agent, or Firm*—Townsend and Townsend and Crew LLP

[57] ABSTRACT

A method and apparatus for renumbering memory arrays may be used in memory systems having a target memory capacity formed from a number (N) of memory arrays. Upon powerup of the memory system, if a portion (M) of the N memory arrays are identified as defective, the memory arrays are renumbered from 0 to (N–M) to provide a logically continuous memory system having a smaller memory capacity than the target memory capacity.

9 Claims, 1 Drawing Sheet

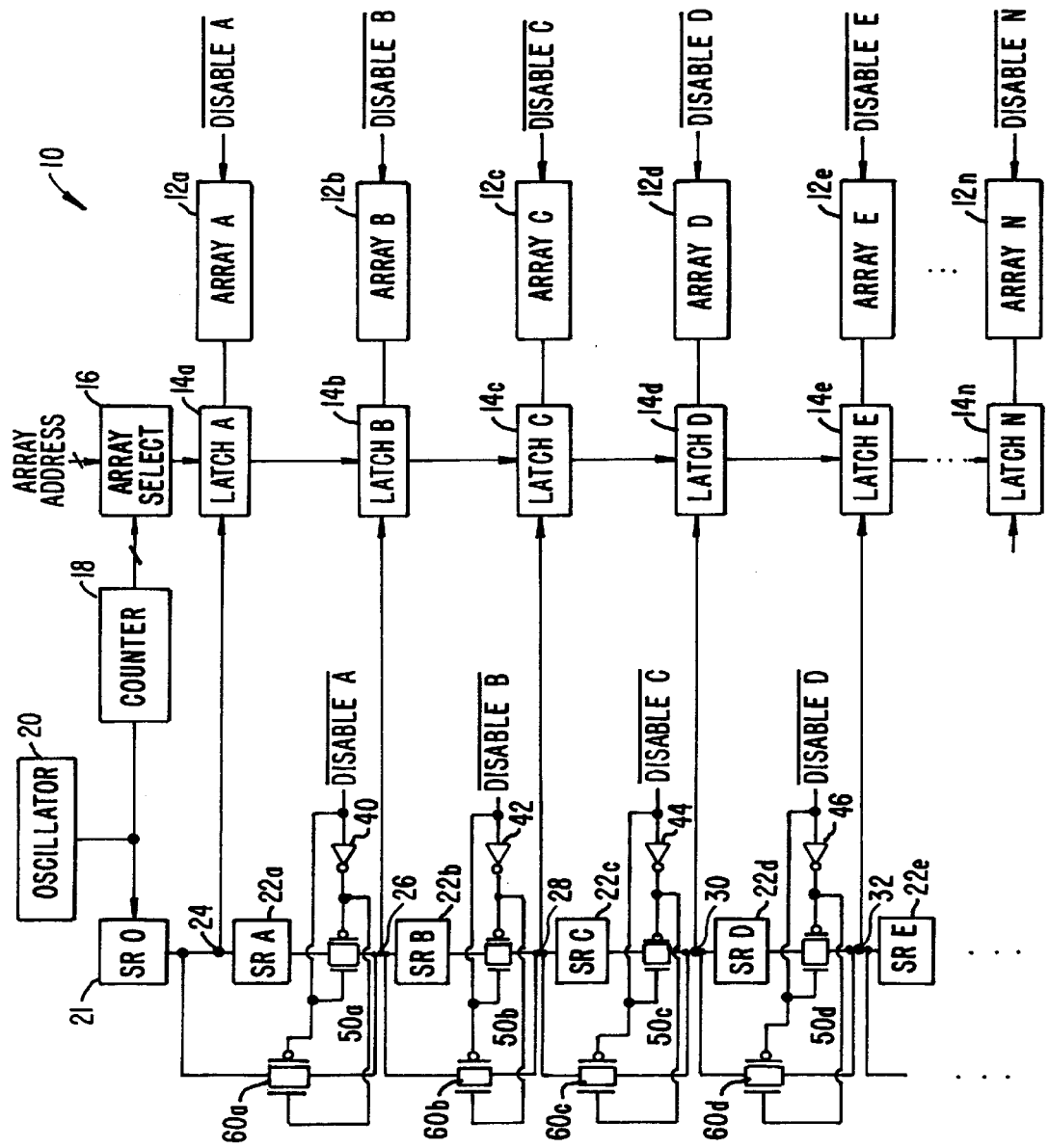

RENUMBERED ARRAY ARCHITECTURE FOR MULTI-ARRAY MEMORIES

BACKGROUND OF THE INVENTION

The present invention relates to memory systems. In particular, the present invention relates to the renumbering of arrays within memory systems.

To reduce manufacturing costs, manufacturers of integrated circuits search for ways to improve yields and reduce the rejection rate for defective individual parts. One method of reducing the rejection rate is to provide redundant or auxiliary circuit components on the integrated circuit. This method is practical where testing can locate the defective component, and the circuit is readily reconfigurable to substitute a redundant equivalent for the defective component. This method is widely used in integrated circuit memory arrays such as random access memories.

Memory circuits are characterized by the regular repetition of multitudes of memory cells. The location of each memory cell is defined by a unique address which typically identifies a particular row and column in the memory matrix arrays. The memory circuit includes row and column decoders that decode different combinations of signals at an address input to the memory circuit. Memory circuits provide for redundancy by including on the same circuit several duplicate rows and/or columns of memory cells to replace any row or column having defective memory cells. Separate decoders are provided for the redundant rows or columns that are programmable using programming elements such as fusible links. Once the integrated circuit is tested and the locations of the defective memory cells are determined, the programmable redundancy decoders are programmed to decode those addresses that correspond to the rows or columns with defective cells. The defective rows or columns are subsequently disabled. This way every time a defective row or column is addressed, a redundant equivalent is selected instead.

Unfortunately, when a memory array has more defective rows or columns than redundant equivalents, the entire memory device must be discarded. Discarding chips having defective bits is wasteful, inefficient and costly.

Accordingly, it would be desirable to provide a memory design which allows a chip with one or more defective memory arrays to be used rather than discarded.

SUMMARY OF THE INVENTION

A method and apparatus for renumbering memory arrays is described, which may be used in memory systems having a target memory capacity formed from a number (N) of memory arrays. Upon powerup of the memory system, if a portion (M) of the N memory arrays are identified as defective, the memory arrays are renumbered from 0 to (N–M) to provide a logically continuous memory system having a smaller memory capacity than the target memory capacity.

In one specific embodiment, the memory arrays form a frame buffer memory for use in a video memory system. The full set of memory arrays (N) forms a 1.5 megabyte video memory. Where one or more of the memory arrays are found to be defective, the memory may be operated as a smaller memory, e.g., as a 1.25 megabyte video memory, by renumbering the arrays which are not defective to form a smaller logically continuous memory.

The result is an ability to use memory chips which otherwise would have been discarded at substantial cost to the manufacturer.

For a fuller understanding of the nature and advantages of the invention, reference should be made to the ensuing description taken in conjunction with the accompanying drawings.

BRIEF DESCRIPTION OF THE DRAWINGS

The FIGURE is a block diagram depicting a generalized multi-array memory arrangement which permits renumbering according to the present invention.

DESCRIPTION OF SPECIFIC EMBODIMENTS

Referring to the FIGURE, a block diagram illustrating a portion of a multi-array memory device 10 is shown. Memory device 10 may be any of a number of memory types known to those skilled in the art, including dynamic and static random access memories used in video applications. In the embodiment shown, logic used to address arrays 12 of the memory is shown. Memory device 10 includes a number of memory arrays 12$a$–$n$ labelled ARRAY_A to ARRAY_N. Each memory array 12 is identified by an address stored in address latches 14$a$–$n$ which are coupled to array address lines through array select driver 16. In one specific embodiment, 48 memory arrays 12 are provided, and six bit array addresses are stored in each address latch 14$a$–$n$. These array addresses are stored in the address latches 14$a$–$n$ upon power-up of the memory device 10 using a counter 18 which increments an array address with each cycle of an oscillator 20. The incremented array addresses are stored in address latches 14$a$–$n$ which are selected by shift registers 22$a$–$n$. In normal operation, when none of the memory arrays 12 has been found to be defective, shift registers 22$a$–$n$ are coupled in series through a number of multiplexors 50$a$–$n$. As oscillator 20 oscillates, a logic one is sequentially passed from shift register 21 through shift registers 22$a$–$n$. When one or more memory arrays 12 are defective, one or more shift registers 22 may be bypassed via one or more multiplexors 60$a$–$n$. A defective array 12 is signaled, in one specific embodiment, by a signal DISABLE# which, when asserted, causes multiplexor 50 to turn off and multiplexor 60 to turn on. Multiplexors 50$a$–$n$ and 60$a$–$n$ may each be formed from a pair of NMOS and PMOS transistors as is known in the art.

Discussion of operation of one specific embodiment of the present invention will now be given assuming that none of the memory arrays 12$a$–$n$ are defective. Upon power-up of the memory device 10, shift registers SR_B through SR_N will be reset to a zero, while shift register SR_A is reset to a logic one. Address latches LATCH_A through LATCH_N may also be reset.

Signals from oscillator 20 are passed to the shift registers 22 and to a counter 18. A first cycle of oscillator 20 causes the logic one in shift register SR_A to pass to shift register SR_B and causes node 24 to become a logic one. All other shift registers (SR_A and SR_C through SR_N) contain a logic zero at this time. The signal on node 24 enables latch LATCH_A to receive and latch data from the address select driver 16. The first cycle of the oscillator 20 also causes counter 18 to increment an address in array select driver 16. For example, the first cycle may cause a six-bit address 000000 to be generated by the address select driver 16. This address is made available to array address latches 14$a$–$n$. In the first cycle of oscillator 20, however, only node 24 is asserted high (i.e., only array address latch 14$a$ is enabled). Thus, address 000000 is stored in array address latch LATCH_A.

In the next cycle of oscillator 20, the logic one from shift register SR_B is passed to the next shift register, SR_C.

This signal passes through multiplexor 50a which is enabled (i.e., is not disabled due to a defective array), resulting in a high signal at node 26. Assertion of node 26 enables latch LATCH_B to receive data from the array select driver 16. The oscillator 20 has also caused counter 18 to increment the address in array select driver 16. Again, as an example, the address may be a six-bit address. As this is the second array address, the address latched into latch LATCH_B may be 000001. This power-up sequence continues until each address latch 14 has stored a unique array address. For example, in a memory device 10 configured with 48 memory arrays, each array is assigned a six-bit binary address from 000000 to 101111.

The memory device 10 may then operate as conventional. Array addresses are received in the array select driver 16 on array address lines and are compared with the addresses stored in the address latches 14 to select a particular memory array 12 for the reading or writing of data.

Embodiments of the present invention permit continued useful operation of the memory device 10 despite one or more of the memory arrays 12 being defective. As an example, if ARRAY_C is found to be defective, memory array 12c may be disabled by asserting (low) a signal DISABLE_C#. In a preferred embodiment, defective memory arrays are disabled by blowing a polysilicon fuse to isolate the array and to prevent the memory array from drawing power. By blowing the fuse, a signal such as DISABLE_C# may be asserted, deselecting multiplexor 50c and selecting bypass multiplexor 60c.

Thus, assuming ARRAY_C is defective, one embodiment of a power-up sequence will occur as follows. Shift register SR_0 is reset to a logic one, while all other shift registers (SR_A–SR_N) are reset to a logic zero. On a first cycle of oscillator 20, the logic one from shift register SR_0 passes to shift register SR_A, pulling node 24 high, and enabling LATCH_A. Counter 18 increments an array address in array select driver 16 to a first address (e.g., 000000). This address is latched into LATCH_A and designates the array address of ARRAY_A. Oscillator 20, on a second cycle, causes the logic one in shift register SR_A to pass to shift register SR_B through multiplexor 50b, pulling node 26 high. Node 24 has returned to a low state. Asserting node 26 enables LATCH_B. LATCH_B latches the next array address generated by counter 18 and array select driver 16 (e.g., 000001). On a third cycle, oscillator 20 causes a logic one to appear at node 28 and is stored in shift register SR_C. This logic one is also passed to node 30 through bypass multiplexor 60c and is stored in shift register SR_E. The third oscillator cycle also results in counter 18 and array select driver 16 generating an incremented array address (e.g., 000010). Because both nodes 28 and 30 are asserted (high), latches LATCH_C and LATCH_D are both enabled and the incremented array address (000010) is stored in both latches. The power-up process continues until every memory array has had an array address stored in address latches 14a–n.

Although the address latch 14 associated with ARRAY_C stores an address, the address is not effective, because memory array ARRAY_C has been disabled, e.g, by blowing a polysilicon fuse. Therefore, ARRAY_C will never respond to an array address of 000010 even though the array address is stored in LATCH_C. Instead, ARRAY_D will respond to this address. The result is an ability to provide a logically continuous memory despite the existence of one or more defective memory arrays.

In one specific embodiment, a total of 48 memory arrays 12 are provided in memory device 10. The total memory size is 1.5 megabytes. 1.5 megabyte memories are commonly used to store pixel information in, e.g, video memory systems. For example, 1.5 megabytes may be logically implemented to store 1,024 bits by 768 bits of pixel information (two bytes each). The data is stored in 48 memory arrays 12, each storing 256K bits. The output of the memory is 128 bits wide, and each array may be organized as 256 rows by 8 columns by 128 bits/column.

Another common video display memory has 1280 by 1024 pixels of one, two, or three bytes each. Each byte of such a system requires 1.25 megabyte. A memory of this size may be implemented using 40 memory arrays 12, each 128 bits wide and organized as 256 rows by 8 columns by 128 bits/column.

In one embodiment of the present invention, a 1.5 megabyte memory chip is formed with 48 memory arrays 12. The memory device 10 may have up to eight defective arrays and still be a useful video memory. If none of the memory arrays 12 are defective, the memory chip is operated as a 1.5 megabyte memory. If any one through eight of the memory arrays 12 are defective, the memory chip may be operated as a 1.25 megabyte memory.

If one or more of the memory arrays 12 are found to be defective, the memory device 10 may still function as a useful, albeit smaller, 1.25 megabyte memory. A flag may be set in the memory device to identify the memory device 10 as one having reduced capacity (e.g., 1.25 megabyte rather than 1.5 megabyte). The result is a memory device 10 which may be used even where a number of arrays are defective after all redundant repair techniques have been exhausted.

As will be appreciated by those familiar with the art, the present invention may be embodied in other specific forms without departing from the spirit or essential characteristics thereof. For example, although an embodiment using shift registers and address latches has been described, any other approach to renumbering the arrays may also be used, so long as a logically continuous memory is attained. Further, although an embodiment designed for use in a video memory device was described, features of the invention may also be used in other memory types and sizes. And while specific logic conventions may have been described, those skilled in the art will recognize that other signal polarities may also be used.

Accordingly, the disclosure of the invention is intended to be illustrative, but not limiting, of the scope of the invention which is set forth in the following claims.

What is claimed is:

1. A method for renumbering memory arrays in a memory system having a target memory capacity, and having a number (N) of memory arrays, the method comprising the steps of:

identifying a portion (M) of said (N) memory arrays which are defective;

renumbering said memory arrays from 0 to (N–M) to provide a logically continuous memory system having a revised memory capacity smaller than said target memory capacity.

2. The method of claim 1, wherein said step of renumbering said memory arrays further comprises the step of:

latching a memory array address in an address latch associated with each memory array.

3. The method of claim 1, further comprising the step of isolating said portion M of memory arrays which are defective.

4. The method of claim 3, wherein said step of isolating includes the step of blowing a fuse to disable each of said portion (M) of memory arrays which are defective, said step of blowing a fuse also bypassing a shift register bit associated with each of said defective arrays.

5. A method for numbering memory arrays in a memory system, the method comprising the steps of:

provinding a number (N) of memory arrays, each of said memory arrays coupled to an address latch;

disabling a portion (M) of the (N) memory arrays which are defective;

bypassing a number (M) of shift registers, each of said bypassed shift registers associated with one of said (M) defective memory arrays; and storing an array address in each of said address latches so that each non-defective memory array is identified by a unique array address.

6. The method of claim 5, wherein said memory system is a video memory system.

7. A memory device having a target memory capacity, the device comprising:

a number (N) of memory arrays, each of said memory arrays coupled to an array address latch;

means for disabling a number (M) of said memory arrays when said number M of memory arrays are defective;

address generation means, coupled to said array address latches, for generating a number (N–M) of sequential array addresses stored in said array address latches.

8. The memory device of claim 7 wherein said address generation means further comprises:

a number of shift registers, each of said shift registers coupled to generate a latch signal to enable said array address latches to latch said sequential array addresses.

9. A video memory system operable with a target memory capacity having N memory arrays, and with a reduced memory capacity having less than N memory arrays, the system comprising:

a number N of array structures, each including a memory array having an address stored in an address latch, said memory array addressed by address lines presented to an array decoder;

address generation means, coupled to each of said address latches of said N array structures, for sequentially generating an address for each of said N array structures during a powerup cycle of said video memory system.

* * * * *